(12) United States Patent
Cherala et al.

(10) Patent No.: US 7,261,830 B2
(45) Date of Patent: Aug. 28, 2007

(54) APPLYING IMPRINTING MATERIAL TO SUBSTRATES EMPLOYING ELECTROMAGNETIC FIELDS

(75) Inventors: Anshuman Cherala, Austin, TX (US); Sidlgata V. Sreenivasan, Austin, TX (US); Norman E. Schumaker, Austin, TX (US)

(73) Assignees: Molecular Imprints, Inc., Austin, TX (US); The University of Texas System, Board of Regents, Austin, TX (US)

(*) Notice: Subject to any disclaimer, the term of this patent is extended or adjusted under 35 U.S.C. 154(b) by 83 days.

(21) Appl. No.: 10/687,562

(22) Filed: Oct. 16, 2003

(65) Prior Publication Data

US 2005/0082253 A1    Apr. 21, 2005

(51) Int. Cl.
*C23F 1/00* (2006.01)
(52) U.S. Cl. .......................................................... 216/44
(58) Field of Classification Search ...................... None
See application file for complete search history.

(56) References Cited

U.S. PATENT DOCUMENTS

| | | | |
|---|---|---|---|
| 3,757,846 A | 9/1973 | Herman, Jr. | |
| 4,119,688 A | 10/1978 | Hiraoka | |
| 4,512,386 A | 4/1985 | Haller | |
| 4,512,848 A | 4/1985 | Deckman et al. | |
| 4,731,155 A | 3/1988 | Napoli et al. | |
| 4,982,796 A | 1/1991 | Lari et al. | |
| 5,028,366 A | 7/1991 | Harakal et al. | |
| 5,425,848 A | 6/1995 | Haisma et al. | |
| 5,601,641 A | 2/1997 | Stephens | |
| 5,670,415 A | 9/1997 | Rust | |
| 5,772,905 A | 6/1998 | Chou | |
| 5,849,209 A | 12/1998 | Kindt-Larsen et al. | |
| 5,849,222 A | 12/1998 | Jen et al. | |
| 5,855,686 A | 1/1999 | Rust | |
| 5,948,219 A | 9/1999 | Rohner | |
| 6,309,580 B1 | 10/2001 | Chou | |
| 6,334,960 B1 | 1/2002 | Willson et al. | |
| 6,355,198 B1 | 3/2002 | Kim et al. | |
| 6,391,217 B2 | 5/2002 | Schaffer et al. | |
| 6,482,742 B1 | 11/2002 | Chou | |
| 6,517,977 B2 | 2/2003 | Resnick et al. | |
| 6,517,995 B1 | 2/2003 | Jacobenson et al. | |

(Continued)

FOREIGN PATENT DOCUMENTS

JP         02-24848         1/1990

(Continued)

OTHER PUBLICATIONS

Chou et al., "Imprint of Sub-25 nm Vias and Trenches in Polymers," Applied Physics Letters, Nov. 20, 1995, pp. 3114-3116, vol. 67(21).

(Continued)

*Primary Examiner*—Allan Olsen
(74) *Attorney, Agent, or Firm*—Kelly K. Kordzik; Fish & Richardson P.C.

(57) ABSTRACT

The present invention comprises a method for applying a liquid, such as imprinting material, to a substrate that features use of an electromagnetic field to rapidly spread the liquid over a desired portion of the substrate, while confining the same to the desired region.

13 Claims, 5 Drawing Sheets

U.S. PATENT DOCUMENTS

| | | | |
|---|---|---|---|
| 6,518,168 | B1 | 2/2003 | Clem et al. |
| 6,518,189 | B1 | 2/2003 | Chou |
| 6,580,172 | B2 | 6/2003 | Mancini et al. |
| 6,646,662 | B1 | 11/2003 | Nebashi et al. |
| 6,696,220 | B2 | 2/2004 | Bailey et al. |
| 6,713,238 | B1 | 3/2004 | Chou et al. |
| 6,776,094 | B1 | 8/2004 | Whitesides et al. |
| 6,809,356 | B2 | 10/2004 | Chou |
| 6,828,244 | B2 | 12/2004 | Chou |
| 6,908,861 | B2 * | 6/2005 | Sreenivasan et al. ....... 438/694 |
| 2001/0026714 | A1 | 10/2001 | Uezono et al. |
| 2002/0042027 | A1 | 4/2002 | Chou et al. |
| 2002/0132482 | A1 | 9/2002 | Chou |
| 2002/0167117 | A1 | 11/2002 | Chou |
| 2002/0177319 | A1 | 11/2002 | Chou |
| 2003/0034329 | A1 | 2/2003 | Chou |
| 2003/0080471 | A1 | 5/2003 | Chou |
| 2003/0080472 | A1 | 5/2003 | Chou |
| 2003/0081193 | A1 | 5/2003 | White et al. |
| 2003/0215577 | A1 * | 11/2003 | Willson et al. ............. 427/458 |
| 2004/0036201 | A1 | 2/2004 | Chou et al. |
| 2004/0046288 | A1 | 3/2004 | Chou |
| 2004/0110856 | A1 | 6/2004 | Young et al. |
| 2004/0118809 | A1 | 6/2004 | Chou et al. |
| 2004/0131718 | A1 | 7/2004 | Chou et al. |
| 2004/0137734 | A1 | 7/2004 | Chou et al. |
| 2004/0156108 | A1 | 8/2004 | Chou et al. |
| 2004/0192041 | A1 | 9/2004 | Jeong et al. |
| 2004/0197843 | A1 | 10/2004 | Chou et al. |
| 2004/0200411 | A1 | 10/2004 | Willson et al. |

FOREIGN PATENT DOCUMENTS

| | | |
|---|---|---|
| JP | 02-92603 | 4/1990 |
| WO | WO99/05724 | 2/1999 |
| WO | WO 00/21689 | 4/2000 |
| WO | WO 01/47003 | 6/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/013693 | 2/2004 |
| WO | WO 2004/016406 | 2/2004 |
| WO | WO 2004/114016 | 12/2004 |

OTHER PUBLICATIONS

Chou et al., "Imprint Lithography with 25-Nanometer Resolution," Science, Apr. 5, 1996, pp. 85-87, vol. 272.

Mansky et al., "Large-Area Domain Alignment in Block Copolymer Thin Films Using Electric Fields," Macromolecules, 1998, pp. 4399-4401, vol. 31.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Willson et al., "Method and System for Fabricating Nanoscale Patterns in Light Curable Compositions Using an Electric Field," U.S. Appl. No. 09/905,718, Filed with USPTO on May 16, 2002.

Sreenivasan et al., "Method and System for Imprint Lithography Using an Electric Field," U.S. Appl. No. 10/194,410, Filed with USPTO Jul. 11, 2002.

U.S. Appl. No. 10/923,629, filed Aug. 20, 2004, Sreenivasan et al.

Translation of Japanese Patent 02-24848.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

Chou, Nanoimprint Lithography and Lithographically Induced Self-Assembly, MRS Bulletin, pp. 512-517, Jul. 1, 2001.

Choi et al., Design of Orientation Stages for Step and Flash Imprint Lithography, Precision Engineering, pp. 192-199, Jan. 1, 2001.

Colburn et al., Step and Flash Imprint Lithography for sub-100 nm Patterning, Proceedings of SPIE vol. 3997, pp. 453-457, Jan. 1, 2000.

Chou et al., Imprint Lithography with Sub-10 nm Feature Size and High Throughput, Microelectronic Engineering 35, pp. 237-240, Jan. 1, 1997.

Haisma et al., Mold-assisted Nanolithography: A Process for Reliable Pattern Replication, J. Vac. Sci. Technol. B, pp. 4124-4128, Nov. 1, 1996.

Johnson et al., Advances in Step and Flash Imprint Lithography, SPIE Microlithography Conference, Feb. 23, 2003.

Colburn et al., Step and Flash Imprint Lithography: A New Approach to High-Resolution Patterning, Proc. Of SPIE, vol. 3676, Mar. 1, 1999.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603, not available, no date.

* cited by examiner

APPLYING IMPRINTING MATERIAL TO SUBSTRATES EMPLOYING ELECTROMAGNETIC FIELDS

BACKGROUND OF THE INVENTION

The field of the invention relates generally to micro-fabrication of structures. More particularly, the present invention is directed at the filling process of an UV curable liquid in a relief structure defined on a template.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed.

Optical lithography techniques are currently used in micro-fabrication. However, these methods are potentially reaching their limits in resolution. Sub-micron scale lithography has been a crucial process in the microelectronics industry. The use of sub-micron scale lithography allows manufacturers to meet the increased demand for smaller and more densely packed electronic components on chips.

An exemplary micro-fabrication technique is shown in U.S. Pat. No. 6,334,960 to Willson et al. Willson discloses a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and to polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required by this technique is dependent upon, inter alia, the time the polymerizable material takes to fill the relief structure.

Thus, there is a need to provide an improved method for the filling of the relief structure with the polymerizable material.

SUMMARY OF THE INVENTION

The present invention comprises a method for applying a liquid, such as imprinting material, to a substrate that features use of an electric field to rapidly spread the liquid over a desired region of the substrate while confining the same to the desired region. To that end, the method includes disposing the liquid between the substrate and the template; positioning the template proximate to the substrate, the template comprising a first region and a second region, lying outside of the first region; and moving the liquid over an area of the substrate in superposition with the first region by applying an electromagnetic field to the liquid. By employing an EM field to spread and confine a imprinting material to a desired area on a substrate, the time that is required to pattern the imprinting material is substantially reduced. By reducing the aforementioned time, the overall time efficiency of an imprint lithography process is improved. This results in increased throughput in imprint lithography.

DETAILED DESCRIPTION OF THE INVENTION

Figure 1:
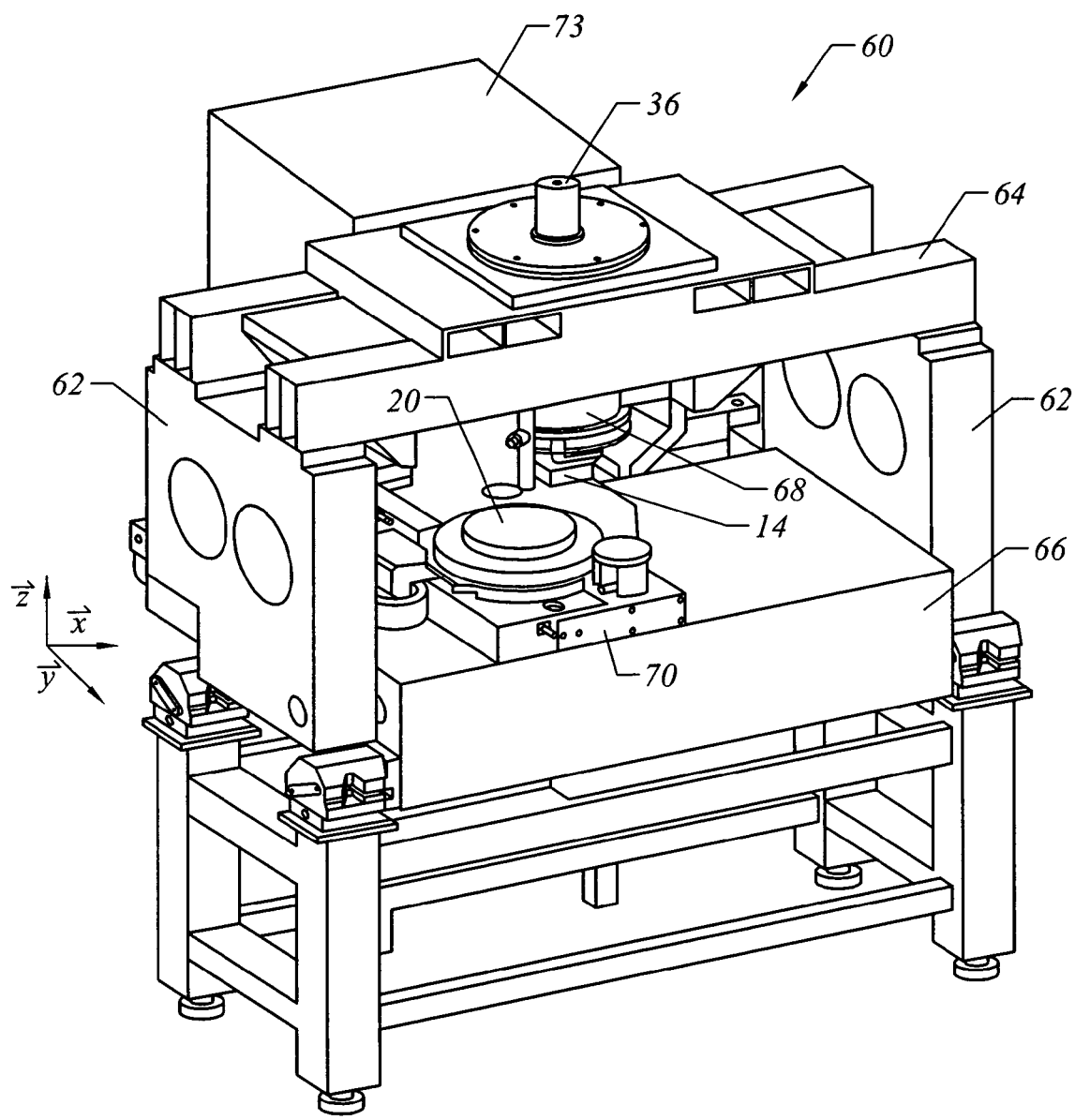
FIG. 1 is a perspective view of a lithographic system.

Described below is a broad overview of an imprint lithography process. FIG. 1 depicts a lithographic system 60 in accordance with one embodiment of the present invention that includes a pair of spaced-apart bridge supports 62 having a bridge 64 and a stage support 66 extending therebetween. Bridge 64 and stage support 66 are spaced-apart. Coupled to bridge 64 is an imprint head 68, which extends from bridge 64 toward stage support 66. Disposed upon stage support 66 to face imprint head 68 is a motion stage 70. Motion stage 70 is configured to move with respect to stage support 66 along X-, Y- and/or Z-axes. An exemplary motion stage device is disclosed in U.S. patent application Ser. No. 10/194,414, filed Jul. 11, 2002, entitled "Step and Repeat Imprint Lithography Systems," assigned to the assignee of the present invention, and which is incorporated by reference herein in its entirety. A radiation source 36 is coupled to lithographic system 60 to impinge actinic radiation upon motion stage 70. As shown, radiation source 36 is coupled to bridge 64 and includes a power generator 73 connected to radiation source 36.

Figure 2:
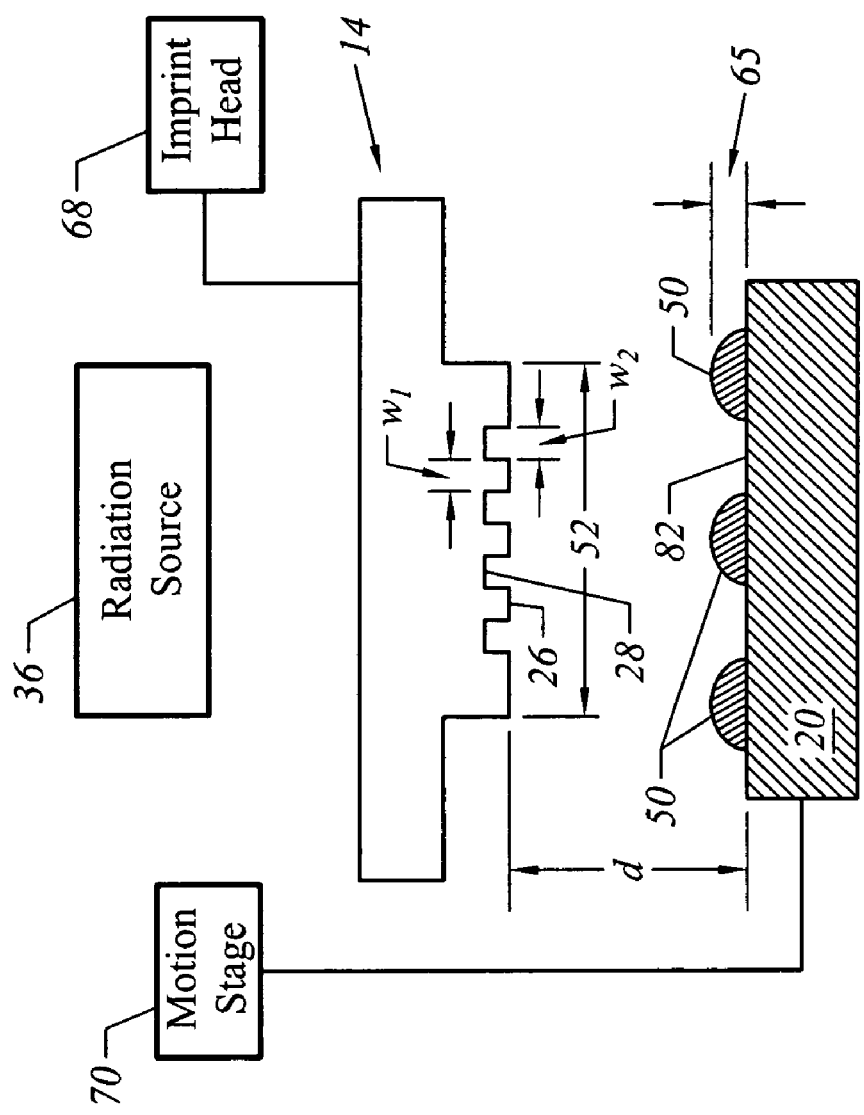
FIG. 2 is a simplified elevation view of a lithographic system shown in FIG. 1.

Referring to both FIGS. 1 and 2, connected to imprint head 68 is a template 14 having a template active area 52 thereon. Template active area 52 includes a plurality of features defined by a plurality of spaced-apart protrusions 26 and recesses 28. The plurality of features defines a relief structure that is to be transferred into a substrate 20 positioned on motion stage 70. Substrate 20 may comprise a bare wafer or a wafer with one or more layers disposed thereon, such as a planarization layer, as discussed in U.S. patent application Ser. No. 10/318,319, filed Dec. 12, 2002 and entitled "Planarization Composition And Method Patterning A Substrate Using The Same," which is incorporated by reference in its entirety herein. Imprint head 68 is adapted to move along X-, Y- and/or Z-axes. As a result, by movement of imprint head 68, motion stage 70 or both, distance "d" between template active area 52 and substrate 20 is varied. In this manner, the features on template active area 52 may be imprinted into a conformable region of substrate 20, discussed more fully below. Radiation source 36 is located so that template active area 52 is positioned between radiation source 36 and substrate 20. Thus, template active area 52 is fabricated from material that allows it to be substantially transparent to the radiation produced by radiation source 36.

Figure 3:
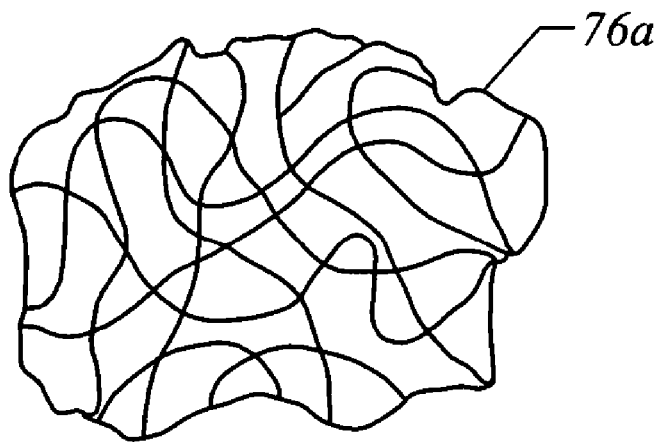
FIG. 3 is a simplified representation of material from which an imprinting layer, shown in FIG. 2, is comprised before being polymerized and cross-linked.

Referring to both FIGS. 2 and 3, a conformable region, such as an imprinting layer 65, is disposed on a portion of a surface 82 that presents a substantially planar profile. It should be understood that the conformable region may be formed using any known technique to produce conformable material, such as a hot embossing process disclosed in U.S. Pat. No. 5,772,905 to Chou, which is incorporated by reference in its entirety herein, or a laser assisted direct imprinting (LADI) process of the type described by Chou et al. in "Ultrafast and Direct Imprint of Nanostructures in Silicon," Nature, Col. 417, pp. 835-837, June 2002.

In the present embodiment, however, conformable region consists of imprinting layer 65 being deposited as a plurality of spaced-apart discrete droplets 50 of material 76a on substrate 20, that may be deposited in any pattern desired, e.g., periodic, aperiodic and the like. Further, droplets 50 may have identical volumes and geometries or may have differing volumes and geometries. An exemplary system for depositing droplets 50 is disclosed in U.S. patent application Ser. No. 10/191,749, filed Jul. 9, 2002, entitled "System and Method for Dispensing Liquids," assigned to the assignee of the present invention, and which is incorporated by reference herein in its entirety. Imprinting layer 65 is formed from material 76a that may be selectively polymerized and cross-linked to record the original pattern therein, defining a recorded pattern. Material 76a is shown in FIG. 4 as being cross-linked at points 76b, forming cross-linked polymer material 76c.

Figure 5:
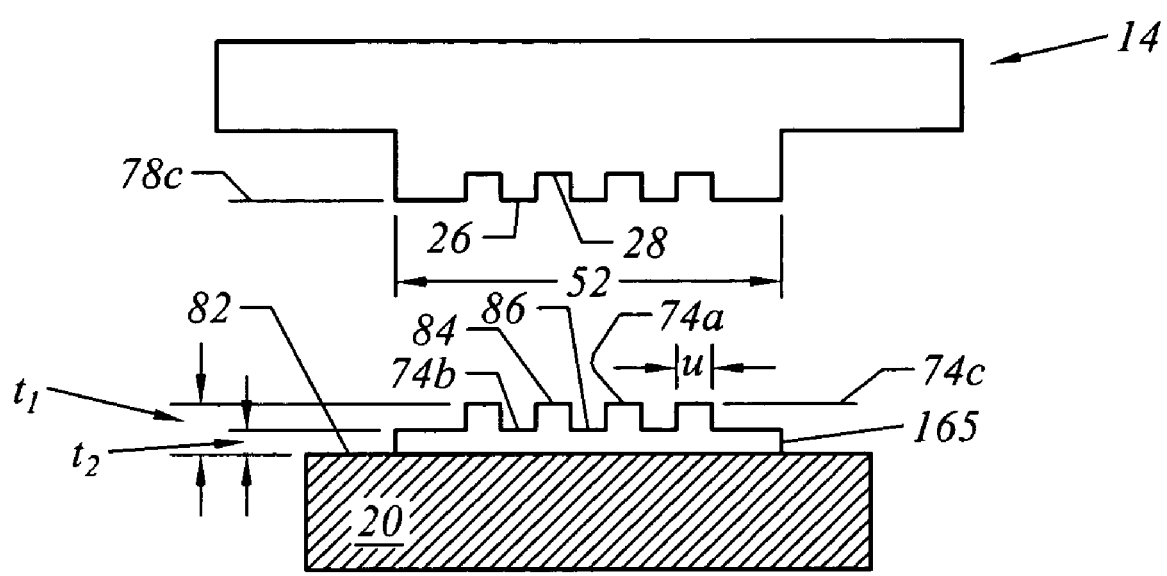
FIG. 5 is a simplified elevation view of an imprint device spaced-apart from the imprinting layer, shown in FIG. 1, after patterning of the imprinting layer.

Referring to FIGS. 2, 3 and 5, the pattern recorded in imprinting layer 65 is produced, in part, by mechanical contact with template active area 52. To that end, imprint head 68 reduces the distance "d" to allow imprinting layer 65 to come into mechanical contact with template active area 52, spreading droplets 50 so as to form imprinting layer 65 with a contiguous formation of material 76a over surface 82. In one embodiment, distance "d" is reduced to allow sub-portions 74a of imprinting layer 65 to ingress into and fill recesses 28.

To facilitate filling of recesses 28, material 76a, typically an organic monomer, is provided with the requisite properties to completely fill recesses 28 while covering surface 82 with a contiguous formation of material 76a. An exemplary embodiment of material 76a is disclosed in U.S. patent application Ser. No. 10/463,396, filed Jun. 16, 2003, and entitled "Method to Reduce Adhesion Between a Conformable Region and a Pattern of a Mold," which is incorporated by reference in its entirety herein. In the present embodiment, sub-portions 74b of imprinting layer 65 in superimposition with protrusions 26 remain after the desired, usually minimum, distance "d" has been reached, leaving sub-portions 74a with a thickness $t_1$ and sub-portions 74b with a thickness $t_2$. Thicknesses "$t_1$" and "$t_2$" may be any thickness desired, dependent upon the application. Typically, $t_1$ is selected so as to be no greater than twice the width u of sub-portions 74a, i.e., $t_1 < 2u$, shown more clearly in FIG. 5. Embodiments presented herein provide a method for confining material 76a to a desired region on substrate 20, wherein the desired region is determined to be in superposition with template active region 52.

Figure 4:
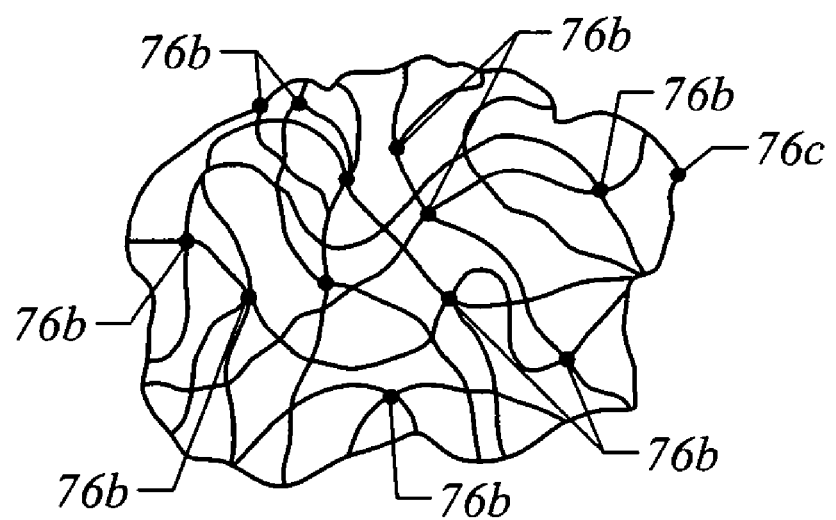
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 36 produces actinic radiation that polymerizes and cross-links material 76a, forming polymer material 76c in which a substantial portion thereof is cross-linked. As a result, material 76a transforms to polymer material 76c, which is a solid, forming an imprinting layer 165, shown in FIG. 5. Specifically, polymer material 76c is solidified to provide a side 74c of imprinting layer 165 with a shape conforming to a shape of a surface 78c of template active area 52, with imprinting layer 165 having protrusions 84 and recesses 86. After imprinting layer 165 is transformed to consist of polymer material 76c, shown in FIG. 4, imprint head 68, shown in FIG. 2, is moved to increase distance "d" so that template active area 52 and imprinting layer 165 are spaced-apart.

Referring to FIG. 5, additional processing may be employed to complete the patterning of substrate 20. For example, substrate 20 and imprinting layer 165 may be etched to transfer the pattern of imprinting layer 165 into substrate 20, providing a patterned surface (not shown). To facilitate etching, the material from which imprinting layer 165 is formed may be varied to define a relative etch rate with respect to substrate 20, as desired.

To that end, imprinting layer 165 may be provided with an etch differential with respect to photo-resist material (not shown) selectively disposed thereon. The photo-resist material (not shown) may be provided to further pattern imprinting layer 165, using known techniques. Any etch process may be employed, dependent upon the etch rate desired and the underlying constituents that form substrate 20 and imprinting layer 165. Exemplary etch processes may include plasma etching, reactive ion etching, chemical wet etching and the like.

Referring to both FIGS. 1 and 2, an exemplary radiation source 36 may produce ultraviolet radiation; however, any known radiation source may be employed. The selection of radiation employed to initiate the polymerization of the material in imprinting layer 65 is known to one skilled in the art and typically depends on the specific application which is desired. Furthermore, the plurality of features on template active area 52 are shown as recesses 28 extending along a direction parallel to protrusions 26 that provide a cross-section of template active area 52 with a shape of a battlement. However, recesses 28 and protrusions 26 may correspond to virtually any feature required to create an integrated circuit and may be as small as a few tenths of nanometers.

Referring to FIGS. 1, 2 and 5, the pattern produced by the present patterning technique may be transferred into substrate 20 to provide features having aspect ratios as great as 30:1. To that end, one embodiment of template active area 52 has recesses 28 defining an aspect ratio in a range of 1:1 to 10:1. Specifically, protrusions 26 have a width W1 in a range of about 10 nm to about 5000 μm, and recesses 28 have a width W2 in a range of 10 nm to about 5000 μm. As a result, template active area 52 and/or template 14, may be formed from various conventional materials, such as, but not limited to, fused-silica, quartz, silicon, organic polymers, siloxane polymers, borosilicate glass, fluorocarbon polymers, metal, hardened sapphire and the like.

Referring to FIGS. 3, 4 and 5, an important requirement in obtaining accurate reproduction of template active area 52 in polymer material 76c is ensuring that material 76a completely spreads over a region of substrate 20 in superimposition with active area 52 in a time efficient manner. To that end, template 14 is configured to apply an electromagnetic field to material 76a so that the same may be attracted to a perimeter of a region of substrate 20 in superimposition with active area 52, while being confined to that region. To that end, template 14 includes a conducting region 18 to facilitate generation of an EM field, shown more clearly in FIGS. 6 and 7.

Figure 6:
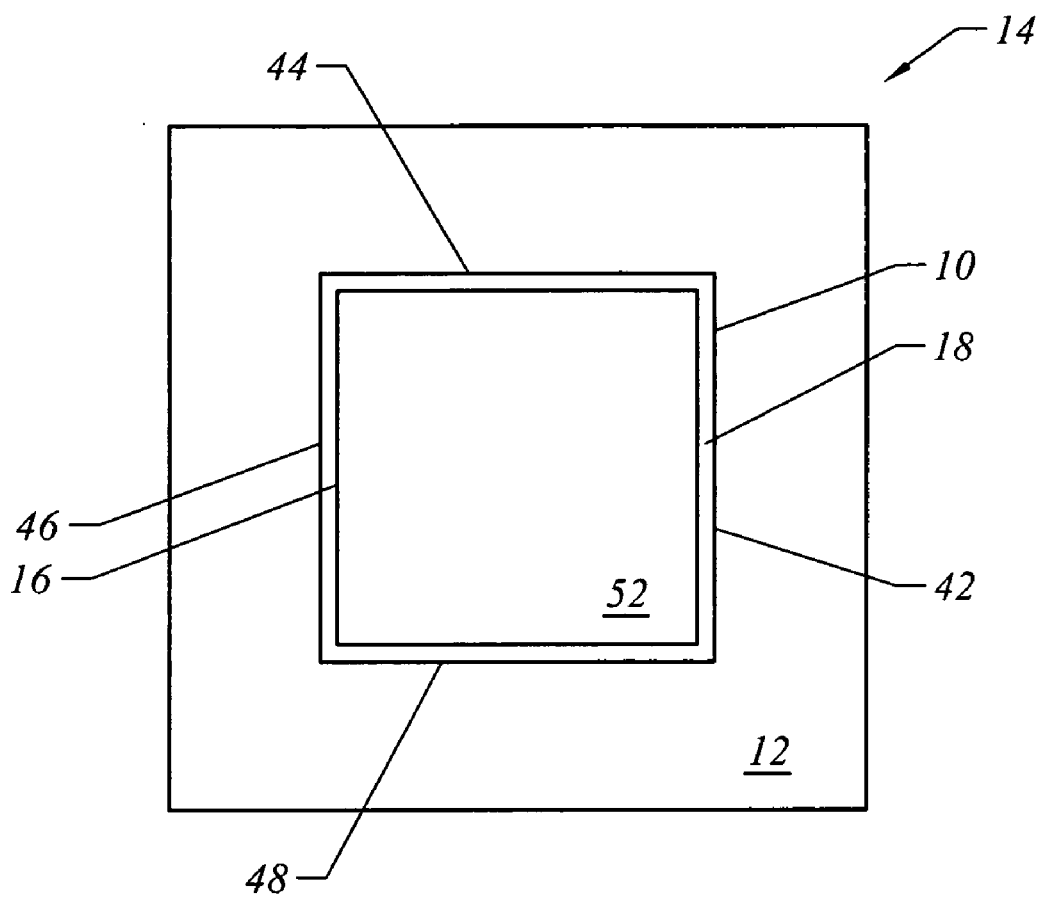
FIG. 6 is a top view of a template comprising a template active area.
Figure 7:
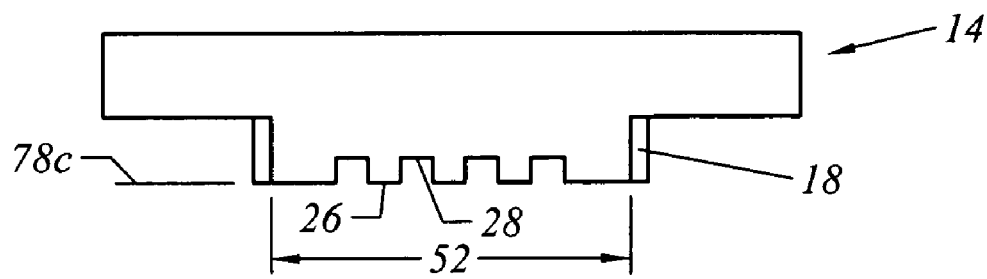
FIG. 7 is a cross-sectional view of a template comprising a template active area.

Referring to both FIGS. 6 and 7, conducting region 18 substantially surrounds a perimeter 16 of template active area 52 of template 14. Inclusion of conducting region 18 with template 14 facilitates rapid spreading of imprinting material 76a over the region of substrate 20 in superimposition with template active area 52 and maintains the absence of material 76a in regions of substrate 20 not in superimposition with template active area 52. This results from the application of a voltage to conducting region 18 which creates an EM field produced. To that end, conducting region 18 is connected to a voltage source (not shown), desired to generate the EM field.

Conducting region may be formed from any suitable material, such as Indium Tin Oxide (ITO). ITO is transparent to visible and UV light and may be patterned using high-resolution e-beam lithography.

While the invention has been described with references to various illustrative embodiments, the description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method of applying a liquid to a substrate the method comprising the steps of:
   disposing the liquid between the substrate and a template as a plurality of spaced-apart droplets;
   positioning the template proximate to the substrate, the template comprising a first region and a second region, lying outside of a perimeter of the first region, the template further comprising electrodes positioned around the perimeter of the first region; and
   moving the liquid to form a contiguous layer of said liquid over an area of the substrate in superposition with the first region by exposing said liquid to an electromagnetic field generated by said electrodes.

2. The method as recited in claim 1, wherein moving further includes moving the liquid over the area and towards the perimeter of the first region while preventing the liquid from moving to portions of the substrate beyond the perimeter of the first region into the second region.

3. The method as recited in claim 1, wherein the first region further includes patterned features comprising protrusions and recesses, wherein moving further includes compressing the liquid with the first region and solidifying the liquid to form a pattern conformal to the patterned features.

4. The method as recited in claim 1, wherein the first region further includes a smooth surface, wherein moving further includes compressing the liquid with the first region and solidifying the liquid to form a pattern conformal to the smooth surface.

5. A method of applying a liquid to a substrate employing a template, the method comprising:
   disposing the liquid on a surface of the substrate as a plurality of spaced-apart droplets;
   positioning the template proximate to the liquid, the template comprising a first region, a second region and a conducting layer, a first portion of which surrounds the first region; and
   generating, with the conducting layer of the template, an electromagnetic field to move the liquid to form a contiguous layer of said liquid over an area of the substrate in superimposition with the first region, while confining the liquid to be absent from portions of the substrate in superimposition with regions of the template outside of the first region.

6. The method as recited in claim 5, wherein the first region further includes patterned features comprising protrusions and recesses, wherein positioning further includes compressing the liquid with the first region and solidifying the liquid to form a pattern conformal to the patterned features.

7. The method as recited in claim 6, wherein disposing further includes depositing, on the substrate, the liquid as a plurality of spaced-apart droplets and generating the electric field further includes moving portions of the liquid in a subset of the plurality of spaced-apart droplets toward a perimeter of the first region.

8. The method as recited in claim 7 further includes, before generating, spreading liquid associated with the spaced-apart plurality of droplets by compressing the plurality of spaced-apart droplets between the template and the substrate.

9. A method of applying a liquid to a substrate employing a template, the method comprising:
   disposing the liquid on a surface of the substrate;
   positioning the template proximate to the liquid, the template comprising a first region, a second region surrounding a perimeter of the first region, and a conducting layer positioned around the perimeter of said first region; and
   generating, with the conducting layer of the template, an electromagnetic field to move the liquid over an area of the substrate in superimposition with the first region towards the perimeter of the first region and not beyond the perimeter into the surrounding second region.

10. The method as recited in claim 9, wherein the first region further includes patterned features comprising protrusions and recesses, wherein positioning further includes compressing the liquid with the first region and solidifying the liquid to form a pattern conformal to the patterned features.

11. A method of applying a liquid to a substrate employing a template, the method comprising the steps of:
   disposing the liquid between the substrate and the template;
   positioning the template proximate to the substrate, the template comprising an active region and an inactive region, lying outside of the active region, wherein the active region includes patterned features of a mold comprising protrusions and recesses, and the inactive region does not include patterned features, the template further comprising a ring of conductors positioned around a perimeter surrounding the active region; and
   completely spreading the liquid over an area of the substrate in superposition with the active region by exposing said liquid to an electromagnetic field generated by the ring of conductors so that the liquid approaches but does not cross over the perimeter surrounding the active region.

12. The method as recited in claim 11, wherein the active region further includes patterned features comprising protrusions and recesses, wherein moving further includes compressing the liquid with the active region and solidifying the liquid to form a pattern conformal to the patterned features.

13. The method as recited in claim 11, wherein disposing further includes depositing, on the substrate, the liquid as a plurality of spaced-apart droplets, wherein moving further includes moving a portion of the liquid in a subset of the plurality of spaced-apart droplets toward the perimeter of the active region.

* * * * *